US009041151B2

(12) United States Patent
Lavoie et al.

(10) Patent No.: US 9,041,151 B2
(45) Date of Patent: May 26, 2015

(54) FIN EFUSE FORMED BY TRENCH SILICIDE PROCESS

(71) Applicant: International Business Machines Corporation, Armonk, NY (US)

(72) Inventors: Christian Lavoie, Pleasantville, NY (US); Effendi Leobandung, Stormville, NY (US); Dan Moy, Bethel, CT (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 13/906,921

(22) Filed: May 31, 2013

(65) Prior Publication Data

US 2014/0353796 A1    Dec. 4, 2014

(51) Int. Cl.
*H01L 21/306* (2006.01)
*H01L 21/283* (2006.01)
*H01L 49/02* (2006.01)

(52) U.S. Cl.
CPC .............. *H01L 28/00* (2013.01); *H01L 21/283* (2013.01); *H01L 21/306* (2013.01)

(58) Field of Classification Search
CPC ..... H01L 28/00; H01L 21/283; H01L 21/306; H01L 23/5256; H01L 23/5252; H01L 21/28518
USPC .......... 257/529, 530; 438/601, 132, 664, 682, 438/381
See application file for complete search history.

(56) References Cited

U.S. PATENT DOCUMENTS

| 7,777,297 | B2 | 8/2010 | Yang et al. |
| 8,053,809 | B2 | 11/2011 | Cheng et al. |
| 8,274,132 | B2 | 9/2012 | Russ et al. |
| 2005/0202664 | A1* | 9/2005 | Jawarani ........................ 438/592 |
| 2005/0212080 | A1 | 9/2005 | Wu et al. |
| 2006/0113626 | A1* | 6/2006 | Kakoschke et al. ........... 257/499 |
| 2007/0026579 | A1 | 2/2007 | Nowak et al. |
| 2007/0029576 | A1 | 2/2007 | Nowak et al. |
| 2007/0075342 | A1* | 4/2007 | Kanemura ..................... 257/288 |
| 2009/0026623 | A1* | 1/2009 | Lavoie et al. ................. 257/762 |
| 2009/0206446 | A1 | 8/2009 | Russ et al. |
| 2010/0197106 | A1* | 8/2010 | Ryou et al. .................... 438/424 |
| 2010/0244144 | A1 | 9/2010 | Hsueh et al. |
| 2010/0301417 | A1 | 12/2010 | Cheng et al. |
| 2012/0018752 | A1 | 1/2012 | Fujiwara et al. |
| 2012/0187528 | A1 | 7/2012 | Cheng et al. |
| 2013/0001741 | A1 | 1/2013 | Mann et al. |
| 2013/0062726 | A1 | 3/2013 | Kurz et al. |

* cited by examiner

*Primary Examiner* — Whitney T Moore
(74) *Attorney, Agent, or Firm* — Steven M. Kellner; Joseph P. Abate

(57) ABSTRACT

A semiconductor structure and method of manufacturing the same are provided. The semiconductor device includes an enhanced performance electrical fuse formed in a polysilicon fin using a trench silicide process. In one embodiment, at least one semiconductor fin is formed on a dielectric layer present on the surface of a semiconductor substrate. An isolation layer may be formed over the exposed portions of the dielectric layer and the at least one semiconductor fin. At least two contact vias may be formed through the isolation layer to expose the top surface of the semiconductor fin. A continuous silicide may be formed on and substantially below the exposed surfaces of the semiconductor fin extending laterally at least between the at least two contact vias to form an electronic fuse (eFuse). In another embodiment, the at least one semiconductor fin may be subjected to ion implantation to facilitate the formation of silicide.

18 Claims, 9 Drawing Sheets

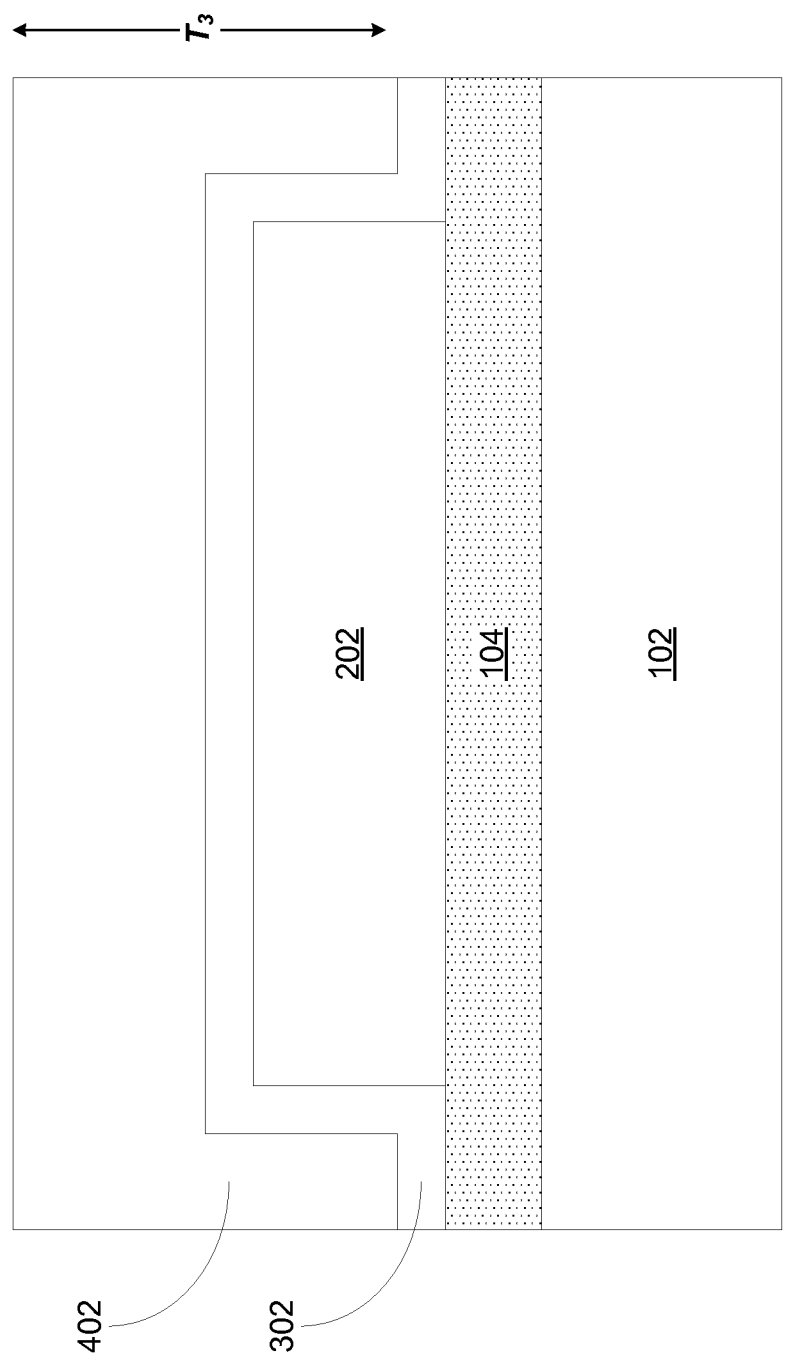

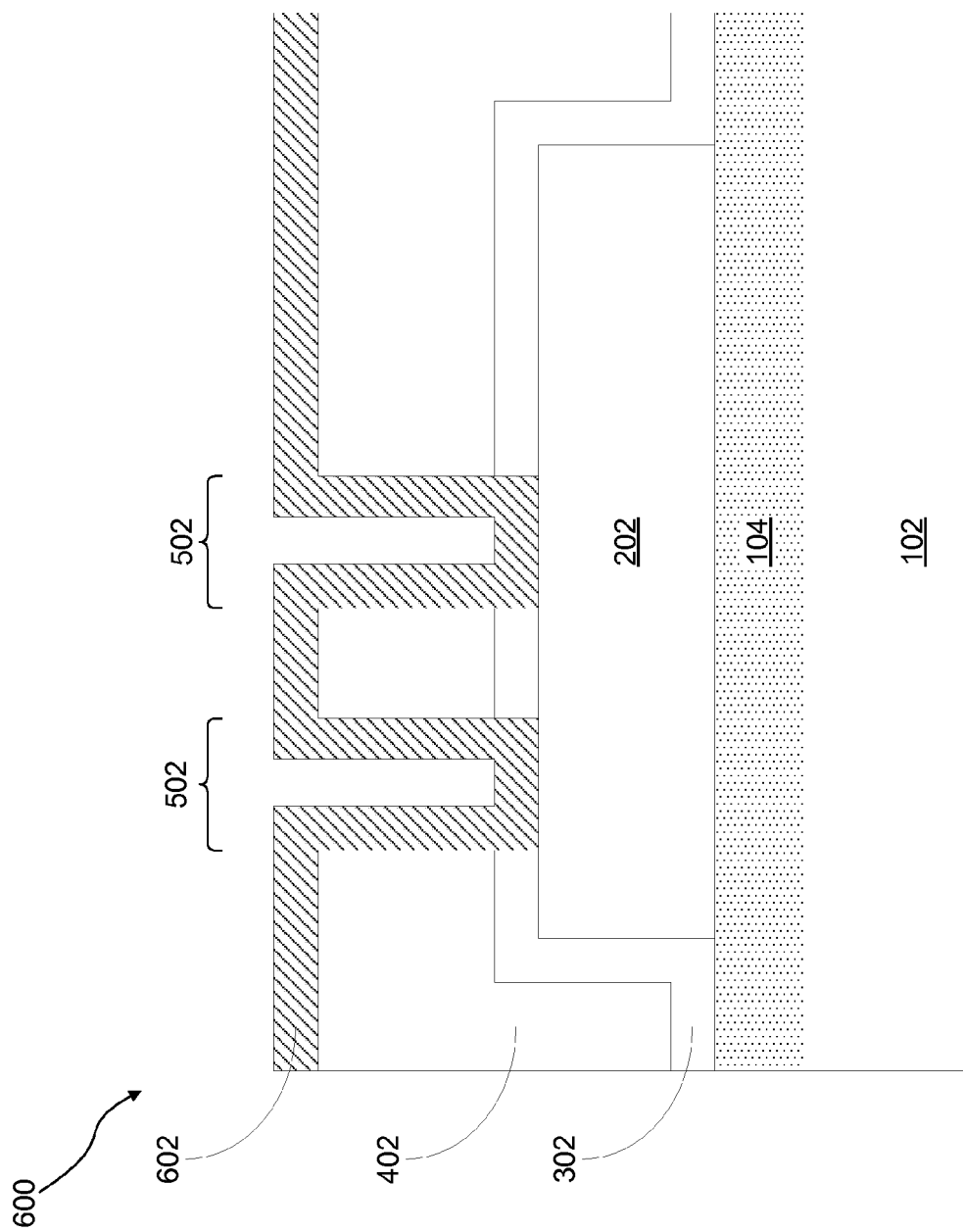

FIN EFUSE FORMED BY TRENCH SILICIDE PROCESS

FIELD OF THE INVENTION

The present invention relates generally to the fabrication of integrated circuits, and more particularly, to a structure and method for fabricating an enhanced performance electrical fuse in a semiconductor device incorporating a polysilicon fin using a trench silicide process.

BACKGROUND OF INVENTION

In addition to transistors, resistors, capacitors, and diodes, semiconductor devices also often contain fuses. These fuses may be used for several purposes. For example, fuses may be used within semiconductor devices for purposes of introducing or deleting customized circuit elements into a semiconductor device. In addition, fuses within semiconductor devices may be used for purposes of severing a non-operative portion of the semiconductor device and replacing that non-operative portion with a redundant semiconductor device fabricated on the same semiconductor substrate. Fuse elements may also be used to provide direct alternative current (DAC) trimming.

Selected fuses are usually blown by either a laser beam, or an electrical current, depending on the design of the fuse/device. In an electrical fuse design, electronically programmable fuses are blown by passing a current through the fuse link. The electrical current then causes a permanent change to the resistance of the fuse. The fuses that are blown are selected by one or more programming methods, which are generally known to those skilled in the art. Electronically programmable fuses, also called eFuses, have become popular because of the circuit and systems design flexibility that they provide. The eFuse can be programmed even when the chip is mounted in the package and installed in the system. For example, users can tailor a design to the specific needs of an application after the product is installed. The eFuse also enables the freedom to alter the design, or fix problems that may occur during the life of the product.

While eFuses are thus desirable within semiconductor device design and fabrication and provide an essential tool for cost effective and efficient semiconductor device design and fabrication, eFuses are not entirely without problems. In particular, as semiconductor device dimensions circuit, and in turn, operating voltages, have decreased, it has become increasingly more difficult fabricate eFuses that are susceptible to comparatively low severing, (i.e., programming) current at typical severing voltages of less than approximately 3 volts. Accordingly, it may be desirable to overcome the deficiencies and limitations described hereinabove.

SUMMARY

According to one embodiment of the present invention, a method of forming a semiconductor device with an enhanced performance electrical fuse formed in a polysilicon fin using a trench silicide process is provided. A method for forming such a semiconductor device may include providing a semiconductor substrate having a dielectric layer and forming at least one semiconductor fin on the top surface of the dielectric layer. An isolating layer may then be formed over the exposed portions of the dielectric layer and the at least one semiconductor fin. The isolating layer may be comprised of a first blocking layer formed conformally over the exposed portions of the dielectric layer and the at least one semiconductor fin and a second blocking layer former over the first blocking layer which may then be planarized. At least two contact vias may then be formed through substantially an entire thickness of the isolating layer. A continuous silicide region may then be formed substantially below the top surface of the at least one semiconductor fin extending laterally at least between the two contact vias. Electrical contacts may then be formed in the contact vias, and the continuous silicide region may be an electronic fuse (eFuse). In another embodiment, a photoresist layer may be formed on the surface of the isolating layer in areas not above the at least one semiconductor fin, and an ion implantation process may be used to damage the at least one semiconductor fin to facilitate silicide formation.

According to another embodiment of the present invention, the structure of a semiconductor device with an enhanced performance electrical fuse formed in a polysilicon fin using a trench silicide process is provided. Such a semiconductor device may include a semiconductor substrate having a dielectric layer, and at least one semiconductor fin above the dielectric layer. The device may also include an isolating layer above the exposed portions of the dielectric layer and the least one semiconductor fin. The isolating layer may be comprised of a first blocking layer formed conformally over exposed portions of the dielectric layer and the at least one semiconductor fin and a second blocking layer formed over the first blocking layer. The device may also include at least two contact vias formed vertically through substantially an entire thickness of the isolating layer above the at least one semiconductor fin. In addition, the device may also include a continuous silicide region substantially below the surface of the at least one semiconductor fin extending laterally at least between the contact vias. The continuous silicide region may be an eFuse. The device may also include electrical contacts in the contact vias, contacting the continuous silicide region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIG. 4 depicts a vertical cross-section of a semiconductor fin after a second blocking layer has been formed on the first blocking layer, according to an embodiment of the present invention.

FIG. 6 depicts a vertical cross-section of a semiconductor fin after a refractory metal layer has been formed on the surface of the second blocking layer, the sidewalls of the contact vias, and the exposed top surface of the semiconductor fin, according to an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
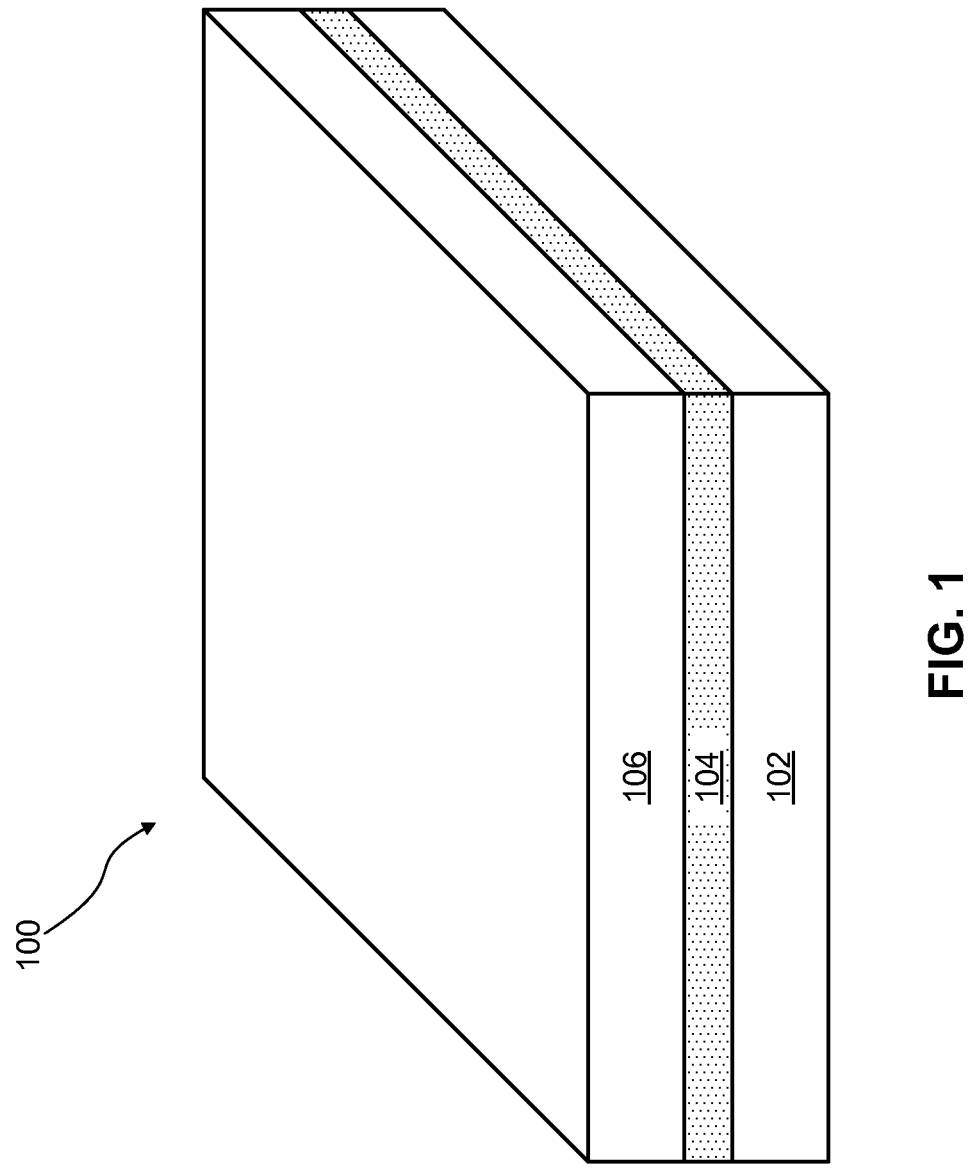
FIG. 1 depicts an isometric view of a semiconductor-on-insulator (SOI) substrate including a dielectric layer, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

The embodiments of the present invention relate generally to the fabrication of integrated circuits, and more particularly to a structure and method for fabricating a semiconductor device and a resistive structure, such as a semiconductor containing fuse, e.g., eFuse, or a semiconductor containing resistor, e.g., polysilicon resistor, on the same substrate, in which at least the gate conductor material of the semiconductor device is not present between the resistive structure and the portion of the substrate on which the resistive structure is positioned. In one embodiment, by ensuring that the gate conductor material of the semiconductor device is not present underlying the semiconductor component of the resistive structure, the present invention reduces the likelihood that the gate conductor material provides a low resistance electrical pathway that can narrow the programming margin of the resistive component.

When describing the following structures and methods, the following terms have the following meanings, unless otherwise indicated.

As used herein, a "semiconductor device" refers to an intrinsic semiconductor material that has been doped, i.e., into which a doping agent has been introduced, to turn it into an extrinsic semiconductor having different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. The switching state from "on" to "off" in a semiconductor device is controlled by a gate structure.

As used herein, a "semiconductor body" refers to a semiconductor material, which is employed as the body of a field effect transistor. The body includes at least the channel of the device.

A "finFET" is a semiconductor device in which the gate dielectric material and gate structure are positioned around the semiconducting body such that the charge flows down the channel on at least the sidewalls of the semiconducting body.

A "gate structure" means a structure used to control output current, i.e., flow of carriers in the channel, of a semiconductor device controlled through electrical or magnetic fields.

As used herein, "p-type" refers to the addition of dopants to an intrinsic semiconductor that creates deficiencies of valence electrons.

As used herein, "n-type" refers to the addition of dopants to an intrinsic semiconductor that contribute free electrons.

As used herein, the terms "dielectric," "insulating," or "insulating properties" denotes a material having a room temperature conductivity of less than $10^{-10}$ $(\Omega\text{-m})^{-1}$.

A "resistive structure" is a semiconductor resistor or a semiconductor containing fuse.

A "semiconductor containing resistor" is a device having a resistor body composed of a semiconductor component, in which the resistive body has a resistivity greater than 0.0001 $\Omega$-cm, and terminals at opposing ends of the semiconductor material.

A "semiconductor containing fuse" is a structure that can be blown by passing a current though a fuse link. The electrical current causes a permanent change to the resistance of the semiconductor containing fuse. The resistance of the semiconductor containing fuse becomes greater after being blown when compared to its original resistance. Depending on the dimensions and materials of the semiconductor containing fuse, the minimum current that is required to low the semiconductor containing fuse may range from about one micron amp to on the order of tens of milliamps.

An "eFuse" is a semiconductor containing fuse including a semiconductor component having a conductive material present thereon, the conductive material including an anode and a cathode being connected by a fuselink, in which the eFuse is blown through electromigration of the conductive material of the fuselink providing an open condition between the anode and the cathode. eFuses may be used to implement array redundancy, field programmable arrays, analog component trimming circuits, and chip identification circuits. Once programmed, the programmed state of an eFuse does not revert to the original state on its own, that is, the programmed state of the fuse is not reversible. For this reason, eFuses are called One-Time-Programmable (OTP) memory elements.

The mechanism for programming an eFuse is electromigration of a metal semiconductor alloy, e.g., silicide, induced by an applied electrical field and an elevated temperature on a portion of the eFuse structure. The metal semiconductor alloy is electromigrated under these conditions from the portion of the eFuse structure, thereby increasing the resistance of the eFuse structure. The rate and extent of electromigration during programming of an eFuse is dependent on the temperature and current density at the electromigrated portion.

An eFuse typically comprises an anode, a cathode, and a fuselink. The fuselink is a narrow strip of a conductive material joining the anode and cathode. During programming of the electrical fuse, a positive voltage bias is applied to the anode and a negative voltage bias is applied to the cathode. As electrical current flows through the fuselink having a narrow cross-sectional area, the temperature of the fuselink is elevated. A high current density combined with the elevated temperature at the fuselink facilitates electromigration of the conductive material, which may comprise a metal silicide.

For purposes of the description hereinafter, the terms "upper," "lower," "right," "left," "vertical," "horizontal," "top," "bottom," and derivatives thereof shall relate to the invention as it is oriented in the drawing figures. Further, it will be understood that when an element as a layer, region, or substrate is referred to as being "on," "atop," "over," "overlying," "below," "beneath," or "underlying" another element, it can be directly on the other element or intervening elements may also be present. In contrast, when an element is referred to as being "directly on," "directly over," or "in direct physical contact" with another element, there are no intervening elements present.

References in the specification to "one embodiment," "an embodiment," "an example," etc., indicate that the embodiment or example described may include a particular feature, structure, or characteristic, but every embodiment may not necessarily include the particular structure, feature, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments and examples whether or not explicitly described.

One method of forming an eFuse utilizing a silicided fin of a finFET device is described in detail below by referring to the accompanying drawings in FIGS. 1-8, in accordance with an illustrative embodiment.

Referring to FIG. 1, an initial structure 100 may be used in one embodiment of the present invention. The initial structure 100 may include a base substrate 102, a dielectric layer 104 present above the base substrate 102, and a SOI layer 106 present above the dielectric layer. The dielectric layer 104 may isolate the SOI layer 106 from the base substrate 102. The dielectric layer 104 may be a crystalline or non-crystalline oxide, nitride, oxynitride, or any other suitable insulating material. The dielectric layer 104 may comprise a single layer of dielectric material or multiple layers of dielectric materials. The dielectric layer 104 may have a thickness ranging from approximately 1 nm to approximately 100 nm.

The SOI layer 106 and base substrate 102 may be made from at least one of any of several known semiconductor materials such as, for example, Si, Ge, SiGe, GeAs, InAs, InP, SiCGe, SiC, as well as other III/V or II/VI compound semiconductors and alloys thereof. The SOI layer 106 and base substrate 102 may comprise the same or different materials. The SOI layer 106 and base substrate 102 may be amorphous, polycrystalline, or monocrystalline. Typically, the base substrate 102 may be about, but is not limited to, several hundred microns thick. In one embodiment, the base substrate 102 may have a thickness ranging from approximately 0.5 mm to approximately 1.5 mm.

The SOI layer 106 may be doped with p-type dopants, such as boron, or doped with n-type dopants, such as phosphorus and/or arsenic. The dopant concentration may range from approximately $1\times10^{15}$ cm$^{-3}$ to approximately $1\times10^{19}$ cm$^{-3}$, preferably approximately $1\times10^{15}$ cm$^{-3}$ to approximately $1\times10^{16}$ cm$^{-3}$. In one embodiment, the SOI layer 106 is undoped. The SOI layer 106 may be approximately 5 nm to approximately 300 nm thick, preferably approximately 30 nm.

It is noted that although the initial structure 100 is described as being an SOI substrate, embodiments of the present invention are contemplated that utilize a bulk semiconductor substrate. In an embodiment in which a bulk semiconductor substrate is used, the bulk semiconductor substrate comprises at least one of Si, Ge, SiGe, GaAs, InAs, InP, SiCGe, SiC, as well as other III/V or II/VI compound semiconductors and alloys thereof. In such an embodiment, a dielectric layer may be epitaxially grown over the bulk semiconductor substrate. A semiconductor-containing layer may then be epitaxially grown over the dielectric layer. The semiconductor-containing layer may then be patterned by any of the etching processes described herein to form semiconductor fins.

Figure 2:
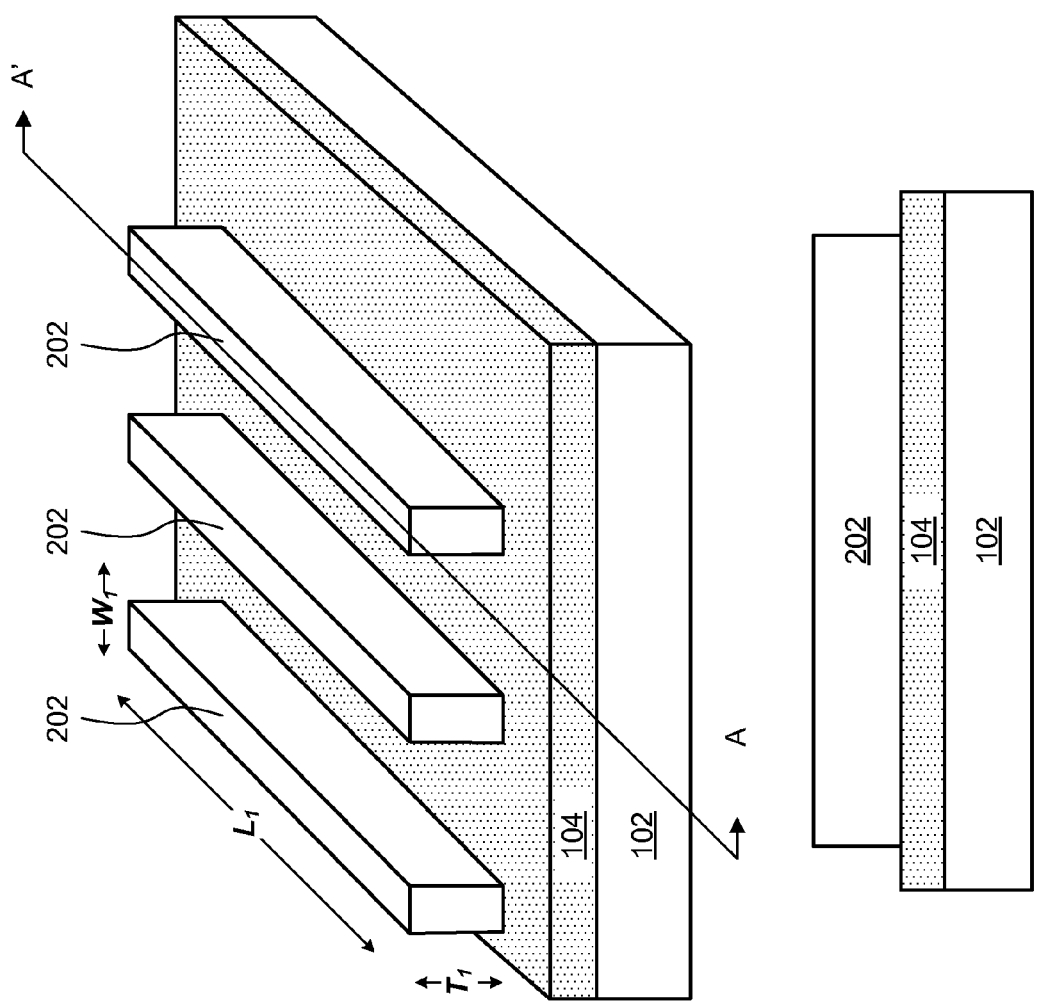
FIG. 2 depicts an isometric view and a vertical cross-section of semiconductor fins formed on the dielectric layer of a SOI substrate, according to an embodiment of the present invention.

Referring to FIG. 2, semiconductor fins 202 may be formed by selectively removing material from the SOI layer 106 (shown in FIG. 1). In an embodiment, a photoresist mask is formed overlying the SOI layer 106 (shown in FIG. 1), in which the portion of the SOI layer 106 (shown in FIG. 1) that is underlying the photoresist provides the semiconductor fins 202 and the portion of the SOI layer 106 (shown in FIG. 1) that is not protected by the photoresist mask is removed using a selective etch process. To provide the photoresist mask, a photoresist layer is first positioned atop the SOI layer 106 (shown in FIG. 1). The photoresist layer may be provided by a blanket layer of photoresist material that is formed utilizing a deposition process such as, for example, chemical vapor deposition (CVD), Plasma-enhanced CVD (PECVD), evaporation, or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the SOI layer 106 (shown in FIG. 1) selective to the underlying dielectric layer 104. In one embodiment, the transferring of the pattern provided by the photoresist into the SOI layer 106 (shown in FIG. 1) may include an anisotropic etch. The anisotropic etch may include reactive-ion etching (RIE). RIE is a form of plasma etching in which during etching the surface to be etched is placed on a RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching, and laser ablation.

In another embodiment, a hard mask dielectric layer may be deposited over the SOI layer 106 (shown in FIG. 1) prior to the formation of the photoresist mask. The hard mask dielectric layer may be composed of a nitride or oxide. The hard mask dielectric layer and a two stage anisotropic etch may be utilized to transfer the pattern from the photoresist mask into the SOI layer 106 (shown in FIG. 1). The two stage anisotropic etch may be conducted, in which a first selective etch removes the exposed portions of the hard mask dielectric layer, wherein the photoresist mask protects the portion of the hard mask dielectric layer that is present beneath the photoresist mask to provide a dielectric cap. The first stage of the anisotropic etch may continue until the portion of the hard mask dielectric layer exposed by the photoresist mask is removed to expose the SOI layer 106 (shown in FIG. 1). In a second stage of the two stage anisotropic etch process, the exposed portions of the SOI layer 106 (shown in FIG. 1) may be removed by an etch chemistry that removes the material of the SOI layer 106 (shown in FIG. 1) selective to the dielectric layer 104. During the second stage of the etch process, the remaining portion of the hard mask dielectric layer functions as an etch mask that protects the underlying portion of the SOI layer 106 (shown in FIG. 1). The remaining portion of the hard mask dielectric layer may then be removed, or remain atop the SOI layer 106 (shown in FIG. 1) as a dielectric cap.

The semiconductor fins 202 may have a width $W_1$ ranging from approximately 5 nm to approximately 50 nm. In a preferred embodiment, the semiconductor fins 202 may have a width $W_1$ ranging from approximately 6 nm to approximately 15 nm. The semiconductor fins 202 may have a thickness $T_1$ ranging from approximately 10 nm to approximately 100 nm. In a preferred embodiment, the semiconductor fins 202 may have a thickness $T_1$ ranging from approximately 20 nm to approximately 60 nm. The semiconductor fins 202 may have a length $L_1$ ranging from approximately 50 nm to approximately 2 µm. In a preferred embodiment, the semiconductor fins 202 may have a length $L_1$ ranging from approximately 100 nm to approximately 500 nm. While the depicted embodiment includes three semiconductor fins, it will be understood that other embodiments may include one or more semiconductor fins. FIG. 2 includes an isometric view of the relevant structure and a cross section view along line A-A'.

After formation of the semiconductor fins 202, a semiconductor body and gate structure for a finFET device may be formed on at least one of the semiconductor fins 202 according to procedures well known in the art. These process steps may be performed concurrently with the process steps disclosed in the present invention. For the sake of clarity and brevity, the process steps for forming a finFET device have been omitted from the present disclosure.

Figure 3:
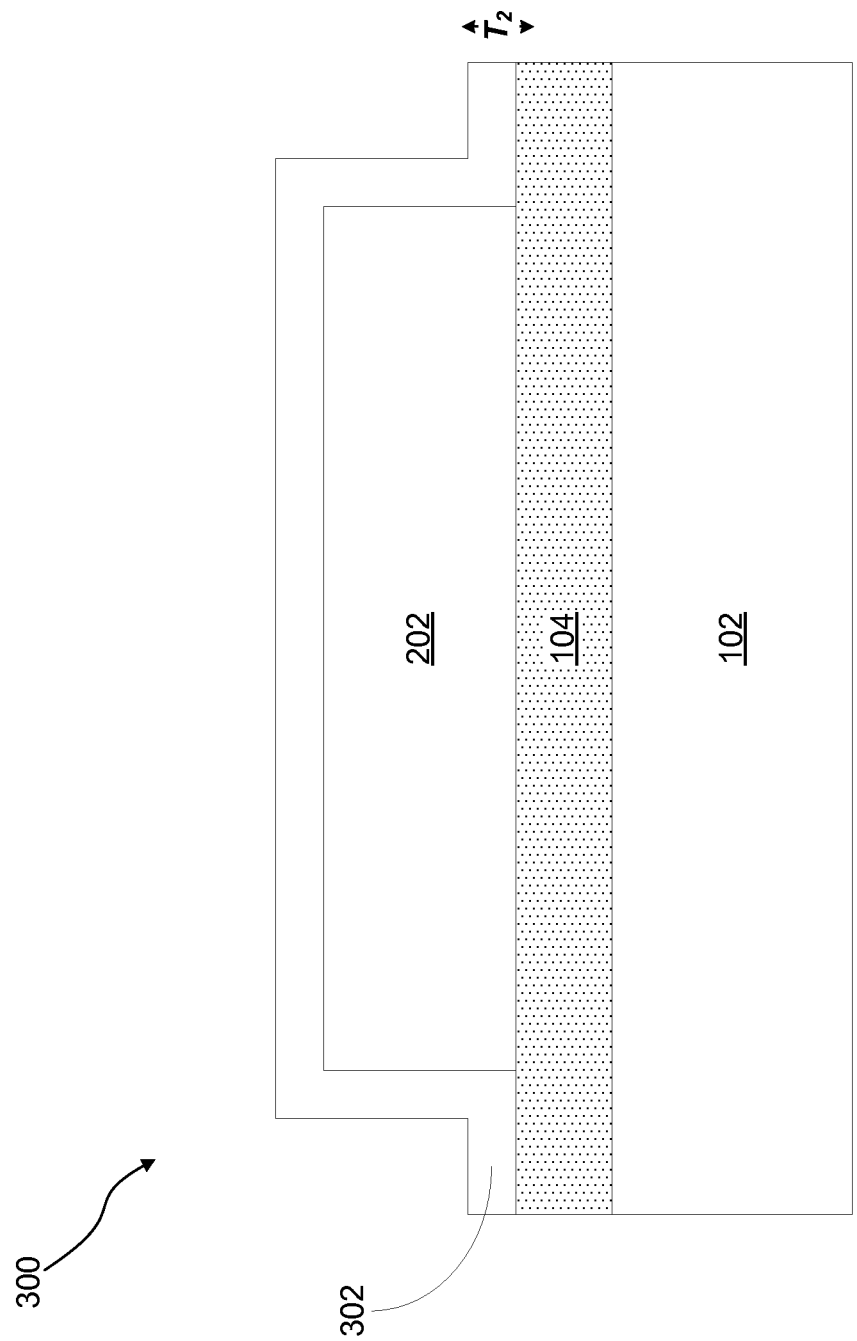
FIG. 3 depicts a vertical cross-section of a semiconductor fin after a first blocking layer has been formed on the surface of the dielectric layer and the surface of the of the semiconductor fin, according to an embodiment of the present invention.

Referring to FIG. 3, structure 300 depicts a cross section view along line A-A' (shown in FIG. 2) perpendicular to the length of one of the semiconductor fins 202. An isolation layer may be formed over the dielectric layer 104 and at least one of the semiconductor fins 202 to provide electrical isolation for the at least one of the semiconductor fins 202. According to an embodiment, the isolation layer may include a combination of two or more blocking layers. The first blocking layer 302 may be conformal to the surface of the dielectric layer 104 and at least one of the semiconductor fins 202. The first blocking layer 302 may be comprised of an insulator such as a nitride, oxide, oxynitride, and/or any combination thereof. In a preferred embodiment, the first blocking layer 302 is comprised of a nitride. In an embodiment, the first blocking layer 302 may be formed by a blanket deposition over the semiconductor fins 202 and portions of the dielectric layer 104. The first blocking layer 302 may be formed by well known methods of deposition such as, but not limited to CVD, PECVD, metal organic chemical vapor deposition (MOCVD), atomic layer deposition (ALD), evaporation, reactive sputtering, chemical solution deposition, and other like processes. In one embodiment, the first blocking layer 302 may have a thickness $T_2$ of approximately 1 nm to approximately 50 nm. In a preferred embodiment, the first blocking layer 302 may have a thickness $T_2$ of approximately 5 nm to approximately 20 nm.

Referring to FIG. 4, a second blocking layer 402 may be formed over the first blocking layer 302. The second blocking layer 402 may be comprised of an insulator such as a nitride, oxide, oxynitride, and/or any combination thereof. In a preferred embodiment, the second blocking layer 402 is comprised of an oxide. The second blocking layer 402 may be formed by a blanket deposition over the first blocking layer 302. The second blocking layer 402 may be formed by well known methods of deposition such as, but not limited to CVD, PECVD, MOCVD, ALD, evaporation, reactive sputtering, chemical solution deposition, and other like processes. After deposition, the second blocking layer 402 may be planarized by well known methods, such as, but not limited to chemical mechanical planarization (CMP). In one embodiment, the second blocking layer 402 may have a thickness $T_3$ of approximately 20 to approximately 400 nm. In a preferred embodiment, the second blocking layer 402 may have a thickness $T_3$ of approximately 50 to approximately 200 nm.

Figure 5A:
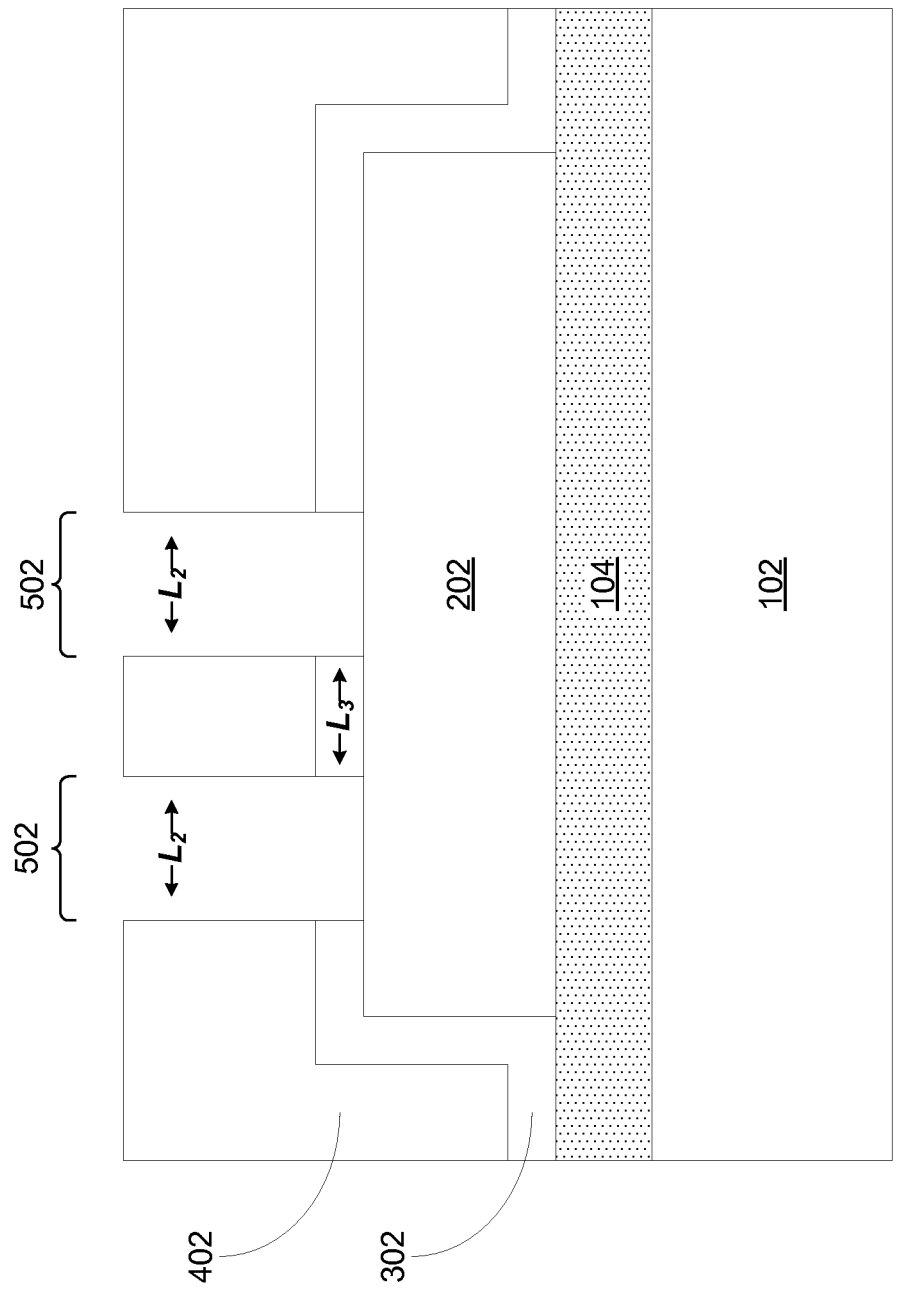
FIG. 5A depicts a vertical cross-section of a semiconductor fin after contact vias have been formed vertically through the second blocking layer and the first blocking layer to reach the surface of the semiconductor fin, according to an embodiment of the present invention.

Referring to FIG. 5A, contact vias 502 may be formed by selectively etching the second blocking layer 402 and the first blocking layer 302. The contact vias 502 may be defined with lithography and etched through the dielectric materials comprising the second blocking layer 402 and the first blocking layer 302, selective to the fin 202, with reactive-ion etching (RIE). In an embodiment, the contact vias 502 may have a length $L_2$ ranging from approximately 20 nm to approximately 60 nm. In a preferred embodiment, the contact vias 502 may have a length $L_2$ ranging from approximately 30 nm to approximately 50 nm. The contact vias 502 may be separated by a length $L_3$ ranging from approximately 10 nm to approximately 50 nm. In a preferred embodiment, the contact vias 502 may be separated by a length $L_3$ ranging from approximately 20 nm to approximately 40 nm.

Figure 5B:
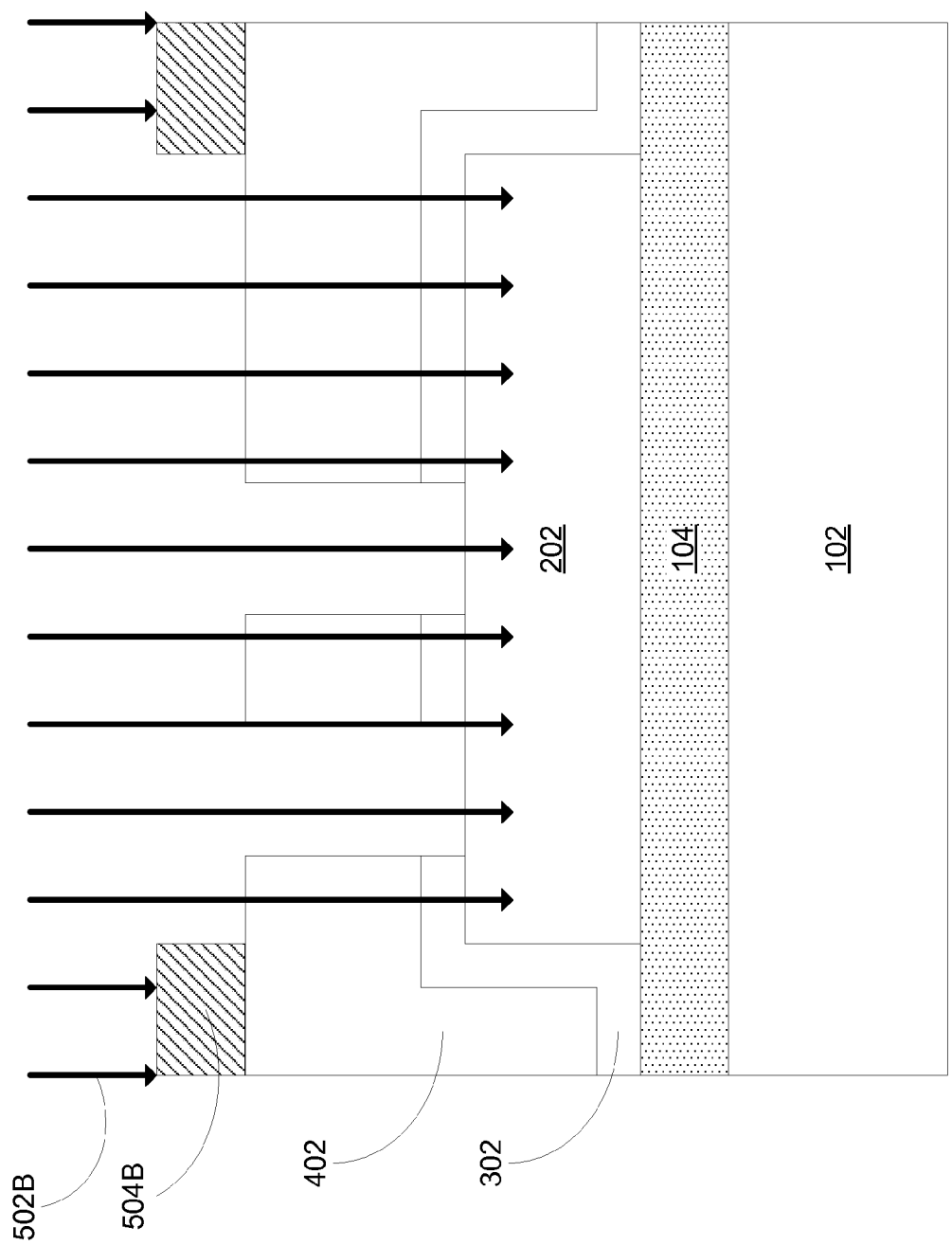
FIG. 5B depicts a vertical cross-section of a semiconductor fin during an ion implantation process after a photoresist pattern has been formed on the surface of the second blocking layer, according to an embodiment of the present invention.

Referring to FIG. 5B, in another embodiment, an ion implantation process 502B may be performed in order to damage the semiconductor fin 202, making it more susceptible to silicidation during later process steps. In this embodiment, a photoresist pattern 504B may be formed on the second blocking layer 402 to isolate the underlying semiconductor fin 202. The photoresist lithography pattern 504B prevents ion implantation in areas other than the desired semiconductor fin 202. After lithography, ions may be implanted through the ion implantation process 502B, which may comprise any ion implantation processes well known in the art. Through the ion implantation process 502B, ions are accelerated and sent through the second blocking layer 402 and the first blocking layer 302 into the semiconductor fin 202. It should be noted that the photoresist lithography pattern 504B may be formed and the ion implantation process 502B may be performed before the contact vias 502 (shown in FIG. 5) are formed, or, alternatively, after the contact vias 502 (shown in FIG. 5) are formed.

The ions in the ion implantation process 502B may include, but are not limited to, argon, xenon, krypton, germanium, silicon, arsenic, phosphorus, antimony, boron, or indium, or some combination thereof. The ion energy of the ion implantation process 502B may range from approximately 5 KeV to approximately 200 KeV. In a preferred embodiment, the ion energy of the ion implantation process 502B may range from approximately 10 KeV to approximately 50 KeV. The dose of the ions in the semiconductor fin 202 may range from approximately $1E13/cm^2$ to approximately $1E16/cm^2$. In a preferred embodiment, the dose of the ions in the semiconductor fin 202 may range from approximately $5E14/cm^2$ to $5E15/cm^2$. The exact implant conditions may vary depending on the type of dopant employed.

Referring to FIG. 6, a refractory metal layer 602 may be deposited over the structure 600 contacting the semiconductor material of the fin 202 in the areas of the fin 202 exposed by the contact vias 502. The refractory metal layer 602 may be formed using conventional deposition techniques including, but not limited to: CVD, PECVD, high-density CVD (HD-CVD), physical vapor deposition (PVD), plating, sputtering, evaporation, and chemical solution deposition. The deposition of the refractory metal layer 602 may be continued until an initial thickness of approximately 25 nm or less, preferably approximately 15 nm or less, even more preferably approximately 10 nm or less, is produced.

In one embodiment, the refractory metal layer 602 may comprise nickel (Ni) or Titanium (Ti). In another embodiment, the refractory metal layer 602 may comprise nickel-platinum (NiPt) alloy. The refractory metal layer 602 may include a nickel concentration ranging from approximately 70 to approximately 95 atomic percent. Preferably, nickel may be present in the alloy in an amount ranging from approximately 90 to approximately 95 atomic percent. The remainder may be platinum and, if present, another metal. In one embodiment, the refractory metal layer 602 may include nickel palladium (NiPd), nickel rhenium (NiRe), titanium (Ti), titanium tantalum (TiTa), titanium niobium (TiNb), or cobalt (Co). Alternatively, other metals commonly employed in salicide processing such as tantalum (Ta), tungsten (W), cobalt (Co), nickel (Ni), platinum (Pt), palladium (Pd), or alloys thereof may be employed.

After the refractory metal layer 602 is formed, the structure 600 may be subjected to a thermal annealing process, using conventional processes such as, but not limited to, rapid thermal annealing (RTA). During the thermal annealing process, the refractory metal layer 602 reacts with the silicon present in the semiconductor fins 202 to form metal silicide. Examples of silicides suitable for this process include, but are not limited to, nickel silicide (NiSi$_x$), nickel platinum silicide (NiPt$_y$Si$_x$), cobalt silicide (CoSi$_x$), tantalum silicide (TaSi$_x$), and titanium silicide (TiSi$_x$). The thermal anneal may be performed in an inert gas environment, which may include helium (He), argon (Ar), nitrogen (N$_2$), or another forming gas. In an embodiment, the thermal anneal may be carried out at a temperature ranging from approximately 200° C. to approximately 500° C. and for a duration ranging from approximately 1 seconds to approximately 60 seconds. The thermal anneal process may be terminated by lowering the surrounding temperature of the entire structure to below approximately 100° C. within a time period from approximately 1 seconds to approximately 30 seconds.

After the annealing process, an etching process may be carried out to remove substantially all un-reacted metal or metal alloy of the remaining portion of the refractory metal layer 602. In one embodiment, the etching process may be carried out by using an etching solution that contains one or more oxidizers such as, for example, sulfuric peroxide, hydrogen peroxide, sulfuric acid, potassium permanganate, hydrochloric acid, ferric chloride, persulfate (e.g., ammonium persulfate, sodium persulfate, or potassium persulfate), nitric acid, a ceric compound (such as, for example, ceric ammonium nitrate), or some combination thereof. In one embodiment, the etching process can be carried out using a solution that contains from approximately 1% to 30% by volume of hydrogen peroxide and from approximately 10% to approximately 90% by volume of sulfuric acid.

In another embodiment, an initial low temperature annealing step may be performed first at lower temperatures, for example from approximately 200° C. to approximately 300° C. Any unreacted metal may then be removed via an etching process as described above. A second annealing step may then be performed at the higher temperatures described above.

Figure 7:
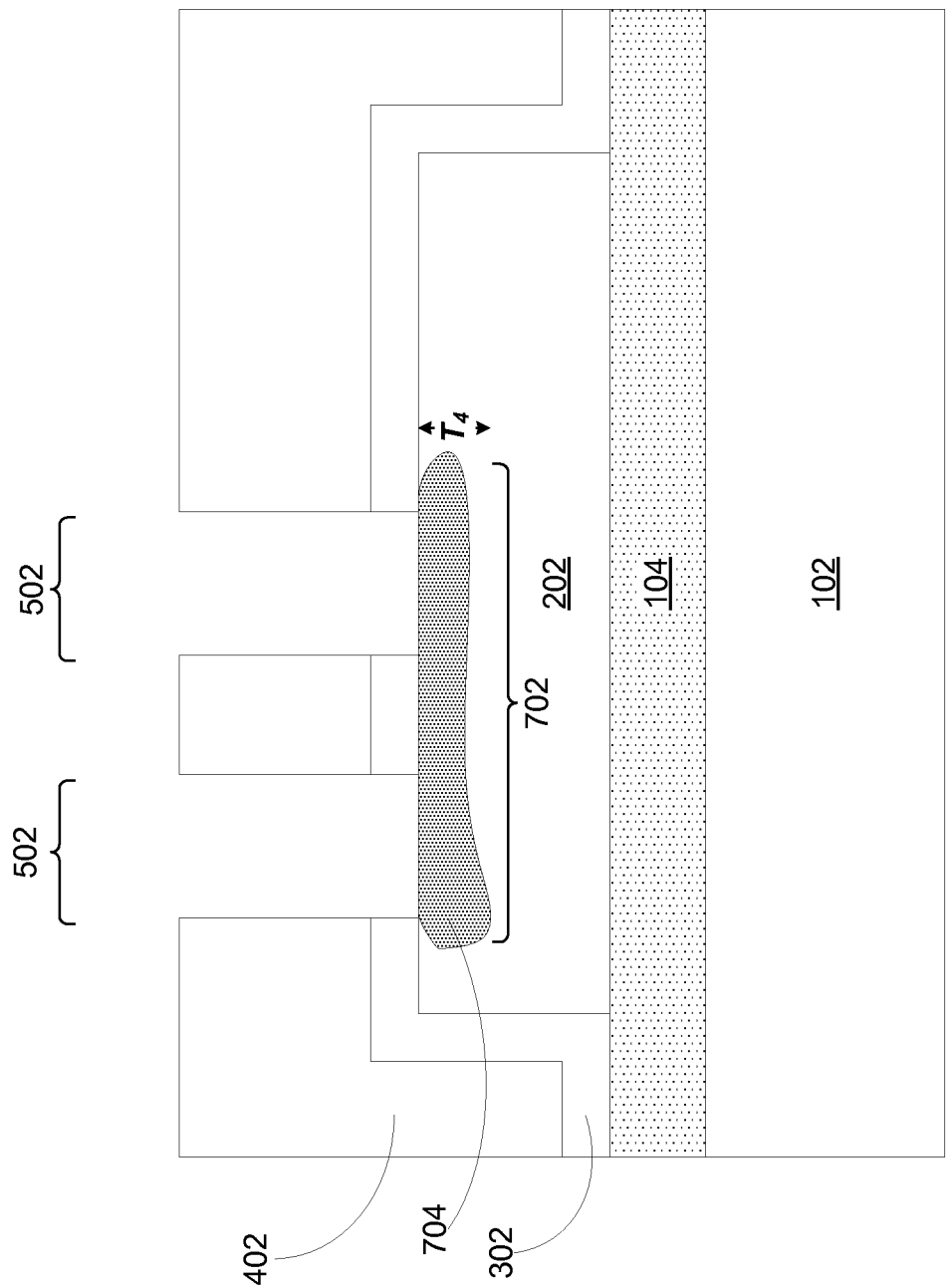
FIG. 7 depicts a vertical cross-section of a semiconductor fin after a silicide eFuse has been formed in the semiconductor fin after a thermal annealing process, according to an embodiment of the present invention.

Referring now to FIG. 7, as a result of the RTA process, the refractory metal layer 602 (shown in FIG. 6) may react with the semiconductor material of the fin 202 to form a silicide 702. The silicide 702 may extend into the semiconductor material of the fin 202. Because of the close proximately of the contact vias 502, the silicide 702 may extend the entire distance between the contact vias 502, L$_3$, to form a continuous silicide eFuse 704. The continuous silicide eFuse may have a thickness T$_4$ of approximately 3 nm to approximately 20 nm. In a preferred embodiment, the continuous silicide eFuse 704 may have a thickness T$_4$ of approximately 3 nm to 10 nm. The continuous silicide eFuse 704 may have a severance voltage of approximately 5 mA to approximately 10 mA.

Figure 8:
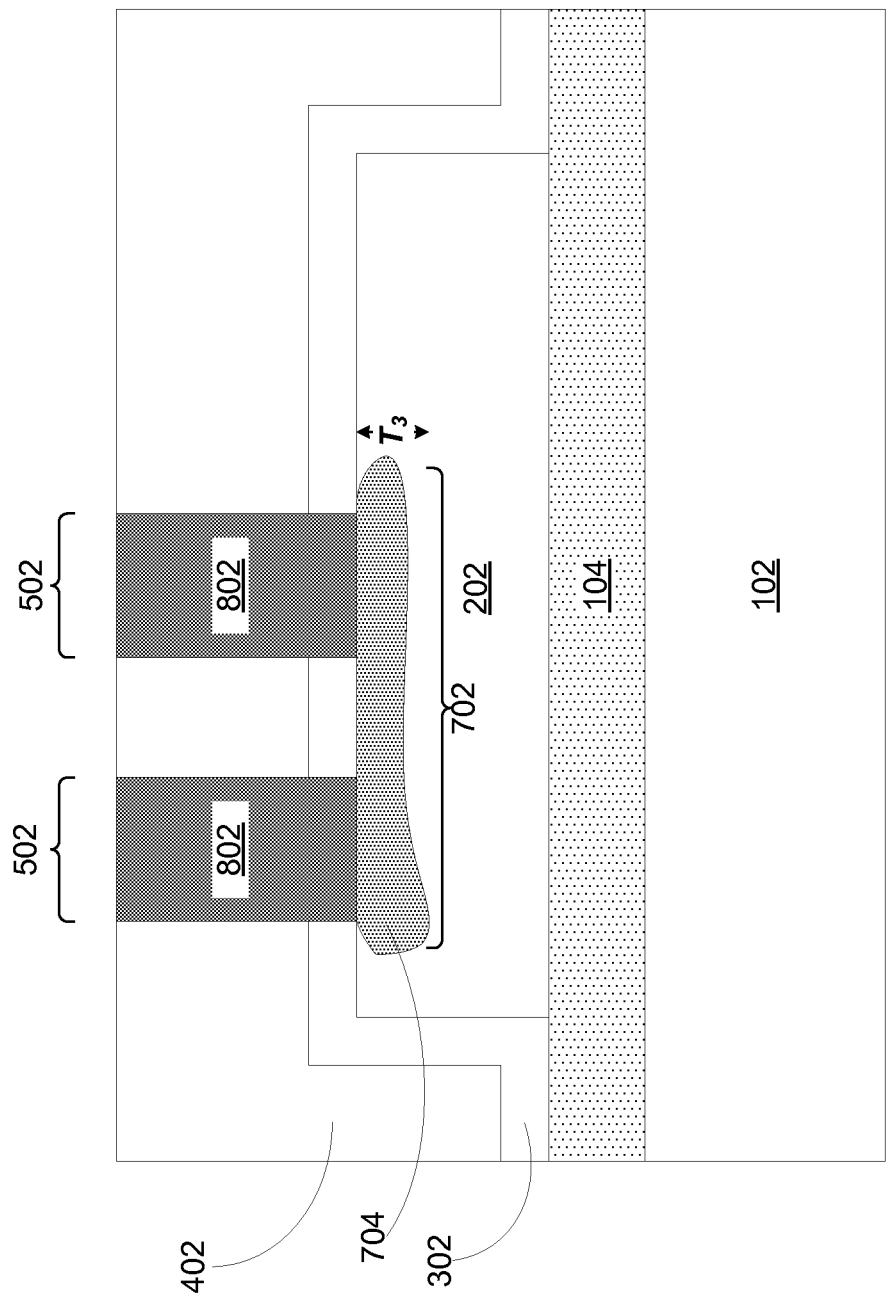
FIG. 8 depicts a vertical cross-section of a semiconductor fin after unreacted refractory metal layer have been removed and electrical contacts have been formed in the contact vias, according to an embodiment of the present invention.

Referring to FIG. 8, electrical contacts 802 may be formed in the contact vias 502 on the surface of the continuous silicide eFuse 704. The electrical contacts 802 may be formed by filling the contact vias 502 with a conductive material that includes, but is not limited to: tungsten, copper, aluminum, silver, gold, alloys thereof, and any suitable combination of those materials using any of the deposition methods listed above. Alternatively, a liner material that includes, but is not limited to titanium nitride (TiN), tantalum nitride (TaN), or ruthenium (Ru) may be first deposited on the walls of the contact via before filling the contact via with conductive material. After deposition, a planarization process such as chemical-mechanical planarization (CMP) may be performed to remove any contact material above the contact via.

The preferred embodiment of the present invention may be formed alongside a finFET device, reducing the number of additional process steps and complications typically required to form eFuses in semiconductor devices. In addition, the use of the thin silicide eFuse formed within the semiconductor fin between the contact vias significantly reduces the current and voltage required to blow the eFuse, enabling it to be used in scaled down devices with lower operating voltages. Furthermore, the formation of an eFuse through the silicidation of a semiconductor fin not covered with additional materials makes the fuse available again for replacement metal gate (RMG) processes in subsequent finFET formation without an additional mask.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a semiconductor substrate having a dielectric layer;
   at least one semiconductor fin above the dielectric layer, the at least one semiconductor fin having a top surface;
   an isolating layer above exposed portions of the dielectric layer and the at least one semiconductor fin;
   at least two electrical contacts formed vertically through substantially an entire thickness of the isolating layer above the at least one semiconductor fin, wherein the at least two contacts are comprised of a metal or metal alloy; and
   a continuous silicide region below the top surface of the semiconductor fin, the continuous silicide region having an upper surface that is substantially flush with an upper surface of the at least one semiconductor fin and extending laterally at least between a bottom surface of the at least two electrical contacts, and the continuous silicide region having a different composition than the at least two electrical contacts.

2. The structure of claim 1, wherein the isolating layer comprises:
   a first blocking layer above the exposed portions of the dielectric layer and the at least one semiconductor fin; and
   a second blocking layer above said first blocking layer.

3. The structure of claim 2, wherein the first blocking layer and the second blocking layer are comprised of nitrides, oxides, oxynitrides, or any combination thereof.

4. The structure of claim 1, wherein the at least one semiconductor fin is comprised of Si, Ge, SiGe, GeAs, InAs, InP, SiCGe, SiC, or alloys thereof.

5. The structure of claim 1, wherein the continuous silicide region is comprised of nickel silicide (NiSix), nickel platinum silicide (NiPtySix), cobalt silicide (CoSix), tantalum silicide (TaSix), or titanium silicide (TiSix).

6. The structure of claim 1, wherein the continuous silicide region has a thickness of approximately 3 nm to approximately 20 nm.

7. The structure of claim 1, wherein the at least two contact vias are separated laterally by a distance of approximately 10 nm to approximately 50 nm.

8. The structure of claim 1, wherein each of the at least two electrical contacts each have a lateral width of approximately 20 nm to approximately 60 nm.

9. The structure of claim 1, wherein the continuous silicide region comprises an electronic fuse (eFuse).

10. A method of forming a semiconductor device, the method comprising:
    providing a semiconductor substrate having a dielectric layer, the dielectric layer having a top surface;
    forming at least one semiconductor fin on the top surface of the dielectric layer the at least one semiconductor fin having a top surface;
    forming an isolating layer over the at least one semiconductor fin and exposed portions of the dielectric layer;
    forming at least two contact vias through substantially an entire thickness of the isolating layer above the at least one semiconductor fin;
    selectively forming a photoresist layer on a top surface of the isolating layer, wherein the photoresist layer leaves a portion of the isolating layer above the at least one semiconductor fin exposed, and performing an ion implantation process that passes through substantially an entire thickness of the isolating layer above the at least one semiconductor fin; and
    forming a continuous silicide region substantially below the top surface of the at least one semiconductor fin, the continuous silicide region extending laterally at least between the at least two contact vias.

11. The method of claim 10, wherein forming the isolating layer comprises:
    forming a first blocking layer conformally over exposed portions of the dielectric layer and the at least one semiconductor fin; and
    forming a second blocking layer above said first blocking layer.

12. The method of claim 10, wherein the ion implantation process comprises:
    subjecting the semiconductor device to accelerated ions of argon, xenon, krypton, germanium, silicon, arsenic, phosphorus, antimony, boron, indium, or any combination thereof.

13. The method of claim 10, wherein the forming a continuous silicide region comprises:
    forming a refractory metal layer over the isolating layer, the sidewalls of the at least two contact vias, and the exposed top surface of the at least one semiconductor fin and subjecting the semiconductor device to an annealing process.

14. The method of claim 13, wherein the subjecting the semiconductor device to an annealing process comprises:
    heating the semiconductor device to a temperature ranging from approximately 200° C. to approximately 500° C. for a duration ranging from approximately 1 second to approximately 60 seconds to cause the refractory metal to react with the semiconductor fin; and
    removing any unreacted portions of the refractory metal layer through an etching process.

15. The method of claim 13, wherein the subjecting the semiconductor device to an annealing process comprises:
    heating the semiconductor device to a temperature ranging from approximately 200° C. to approximately 300° C. for a duration ranging from approximately 1 second to approximately 60 seconds to cause the refractory metal to react with the semiconductor fin;
    removing any unreacted portions of the refractory metal layer through an etching process; and
    heating the semiconductor device to a temperature ranging from approximately 200° C. to approximately 500° C. for a duration ranging from approximately 1 second to approximately 60 seconds.

16. The method of claim 10, wherein the semiconductor substrate comprises a semiconductor-on-insulator (SOI) substrate and wherein the forming at least one semiconductor fin on a surface of a dielectric layer comprises selectively etching a SOI layer of the SOI substrate.

17. The method of claim 10, wherein the forming at least one semiconductor fin on the top surface of the dielectric layer comprises:
    epitaxially growing the dielectric layer on a bulk semiconductor substrate;
    epitaxially growing a semiconductor-containing layer on the dielectric layer; and
    patterning and selectively etching the semiconductor-containing layer.

18. The method of claim 10, further comprising forming electrical contacts in the at least two contact vias, the electrical contacts contacting an upper surface of the continuous silicide region.

* * * * *